United States Patent [19]

Fegley

[11] 4,157,486
[45] Jun. 5, 1979

[54] ELECTROLUMINESCENT DISPLAY AND CIRCUIT PROTECTIVE DEVICE AND METHOD OF MAKING

[75] Inventor: Charles R. Fegley, Laureldale, Pa.

[73] Assignee: Western Electric Company, Inc., New York, N.Y.

[21] Appl. No.: 902,611

[22] Filed: May 3, 1978

Related U.S. Application Data

[63] Continuation-in-part of Ser. No. 862,253, Dec. 19, 1977, abandoned.

[51] Int. Cl.² ............... H01J 7/44; H01H 85/32; H05B 33/04; H05B 33/10
[52] U.S. Cl. ................................ 315/71; 313/499; 313/512; 315/318; 337/228; 337/231; 337/237; 337/242; 340/638; 29/25.13; 29/25.15; 29/577 R; 29/623; 29/588; 29/589; 29/591; 357/72
[58] Field of Search ............... 315/71, 318; 313/318, 313/449, 512; 357/72, 73; 337/227, 228, 231, 237, 242, 266; 340/638; 29/577, 588, 589, 591, 25.13, 25.15, 623, 627

[56] References Cited

U.S. PATENT DOCUMENTS

| | | | |
|---|---|---|---|
| 2,726,378 | 12/1955 | Norcross | 340/638 |
| 4,025,888 | 5/1977 | Judd et al. | 337/266 |
| 4,054,814 | 10/1977 | Fegley et al. | 315/71 |

*Primary Examiner*—Alfred E. Smith
*Assistant Examiner*—Charles F. Roberts
*Attorney, Agent, or Firm*—R. Y. Peters

[57] ABSTRACT

An electroluminescent display device includes at least two conductive leads spaced from each other with a light-emitting element electrically coupled between such leads. A transparent, insulating base is formed about and between the leads. The base encapsulates both the leads and the light-emitting element.

At least one lateral portion of each lead extends beyond the base and substantially conforms to the configuration of the base. In conforming such lateral portions, they are preferably wrapped around the base and fixed to it. These lateral portions are arranged so that light from the light-emitting element may pass axially through the base and out of its ends. In addition, light may pass laterally out of the base.

The device may also be used for circuit protection purposes. To so use the device, a protective element is electrically coupled between the leads so that upon the occurrence of an overload condition in an external circuit coupled to the lateral portions, the protective element decouples the leads. Such decoupling results in the energization and illumination of the light-emitting element. The illumination indicates that an overload condition has occurred in the external circuit.

The device may also be used simply for protection purposes. In this case a light-emitting element is not used.

The device readily lends itself to fabrication in a lead-frame environment involving various metal forming steps, such as stamping, cutting, shaping, bending, and the like. These steps are used to form the leads and the lateral portions from a sheet of conductive material.

31 Claims, 17 Drawing Figures

ELECTROLUMINESCENT DISPLAY AND CIRCUIT PROTECTIVE DEVICE AND METHOD OF MAKING

CROSS-REFERENCE

This application is a continuation-in-part of co-pending application of Ser. No. 862,253, filed Dec. 19, 1977, now abandoned.

BACKGROUND OF THE INVENTION

1. Field of the Invention

This invention relates to an electroluminescent display and circuit protective devices, and methods of making the same. More particularly, this invention relates to such devices having external conformal contacts and methods of making the same. This invention further relates to such devices having plastic encapsulated bases with wrap-around contacts formed about opposed ends of the bases. Also, this invention relates to such devices having a protective element, such as a fuse, electrically coupled between its contacts, so that such devices may be used for circuit protection purposes.

As used herein, electroluminescent refers to radiation from electrically excited solid-state elements.

2. Description of the Prior Art

Electroluminescent display devices such as light-emitting diodes have been used extensively in communication equipment for a wide variety of applications requiring some form of visual indicating means. For example, light-emitting diodes have been used in place of switchboard, key button or similar lamps. (See U.S. Pat. No. 4,054,814 to C. R. Fegley et al. assigned to the assignee of record.)

Such devices have also been used for indicating that a circuit protective device, such as a fuse, has been subjected to an electrical overload condition. (See U.S. Pat. No. 4,025,888 to Judd et al., assigned to Bell Telephone Laboratories and the aforementioned U.S. Pat. No. 4,054,814.) Also, fuses have been extensively used to protect communication and other electrical devices.

It is desirable to simplify the assembly techniques of these prior art devices to thereby reduce this cost. It is also desirable to package the fuse and the light-emitting diode in the same housing to aid in the simplification of such devices.

Further, it is advantageous to assemble these devices in a lead-frame environment, wherein a portion of the lead frame is formed about the bases of the devices to form contacts for connecting them to external circuits. And in the simplification of these devices, it is advantageous to bond a light-emitting diode chip directly to a current-limiting chip, both chips being bonded to another portion of the lead frame.

In circuit protective devices have electroluminescent display elements such as light-emitting diodes, it is advantageous to have light from such diodes pass not only laterally out of the bases of the devices, but also axially out of its ends. This aids in determining which of many such devices has been subjected to an electrical circuit overload condition regardless of whether such devices are viewed laterally or axially. And this is particularly important if the devices are located in a generally dark inaccessible location, such as under or behind telephone switchboards or control cabinets or under the dashboard of a car.

Moreover, it is desirable to indicate the current carrying capacity of combined electroluminescent display and circuit protective devices. This may advantageously be done with a color-coding scheme wherein the color of the light emitted from the device corresponds with the color of a band on the device indicating the current carrying capacity of the device.

SUMMARY OF THE INVENTION

It is, therefore, an object of this invention to provide new improved electroluminescent display devices and methods of making them.

Another object of the invention is the provision of improved electroluminescent display devices having plastic encapsulated body portions with wrap-around contacts formed about opposed ends of the body portions.

Still another object to the invention is the provision of a light-emitting diode device having a protective element, such as a fuse, electrically coupled between its contacts. As a result, the device may be used for circuit protection purposes wherein the energization of the diode indicates that an overload condition has occurred.

With these and other objects in view the present invention contemplates a new electroluminescent display device having at least two conductive leads spaced from each other with a light-emitting element electrically coupled between such leads. A transparent insulating base is formed about and between the leads and encapsulates the light-emitting element. At least one lateral portion of each lead extends beyond the base. Such lateral portion is formed about the base such that it substantially conforms to its configuration.

In addition, the present invention contemplates a protective device wherein a protective element is electrically coupled between the leads. Upon the occurrence of an overload condition in a circuit coupled to the lateral portions of the leads, the protective element decouples the leads resulting in the energization of the light-emitting element.

The present invention also contemplates a protective device similar to the electroluminescent display device except that a light-emitting element is not electrically coupled between the leads of the device.

Further, the present invention contemplates a new method of making an electroluminescent display device. The method includes forming from a sheet of conductive material leads spaced from each other, and electrically coupling a light-emitting element between such leads. Then, at least one lateral portion is formed from the sheet for each lead integral with such lead. Next, a transparent insulating base is formed about and between the leads and encapsulates the leads and the light-emitting element. And the lateral portions are left extending beyond the sides of the base after its formation. Finally, such lateral portions are substantially conformed to the configuration of the base.

To make such electroluminescent display device also into a protective device with indicating means, a protective element is coupled between the leads. If a protective device is desired without any indicating means, then the light-emitting element is eliminated.

BRIEF DESCRIPTION OF THE DRAWING

Other objects and advantages of the present invention may be more clearly understood by reference to the following detailed description and drawing, wherein.

DETAILED DESCRIPTION

First, the preferred embodiment of an electroluminescent display and circuit protective device of the present invention will be described in detail. Then, methods of making it will be described, followed by various other embodiments of the invention.

Electroluminescent Display and Circuit Protective Device

Figure 1:
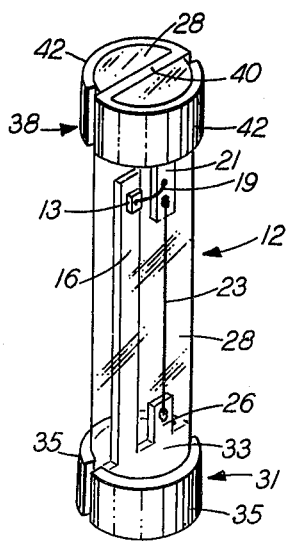
FIG. 1 is a slightly enlarged, perspective view of an electroluminescent display and circuit protective device of the present invention, showing contacts that have been conformlly shaped about opposite leads of the base of the device.
Figure 2:
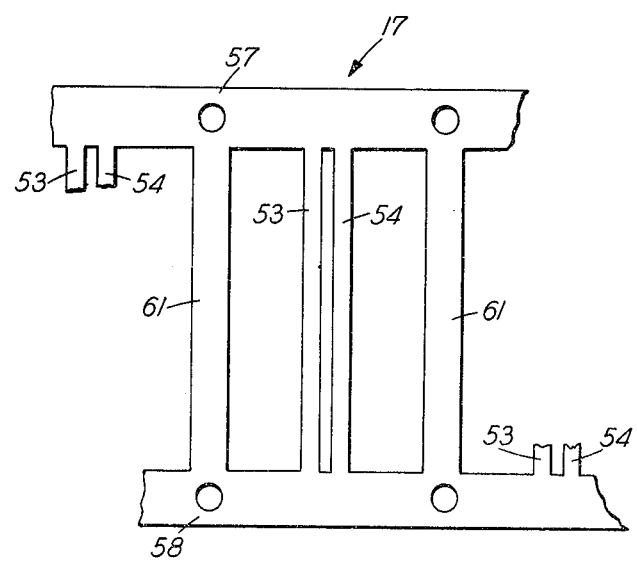
FIG. 2 is a front elevational view of a lead frame. illustrating a stage in the process of making the device of FIG. 1.
Figure 3:
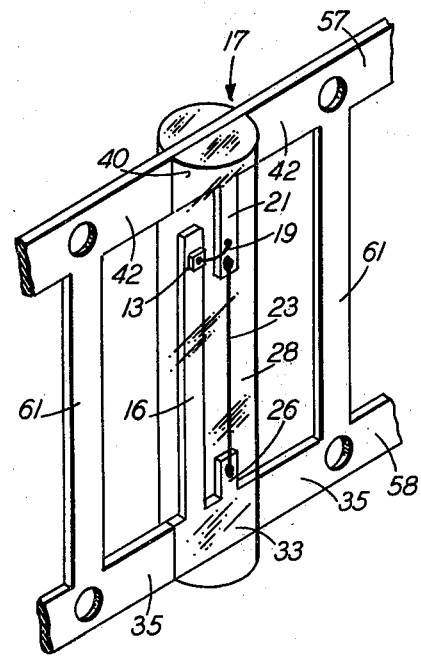
FIG. 3 is a perspective view of an assembly including the lead frame of FIG. 2 and a light-emitting and a protective element bonded thereto, showing a base for the device of FIG. 1 encapsulated about such assembly and illustrating another stage in making such device.

Referring now to FIG. 1 an electroluminescent display and circuit protective device of the present invention, designated generally 12, is shown. The device 12 includes as its light-emitting element a light-emitting diode chip 13 having one of its terminals bonded to a lead 16 of a lead frame 17 (FIGS. 2 and 3). A wire 19 is bonded to the other terminal of the chip 13 and to another lead 21 spaced from the lead 16.

The device 12 may be used simply for illumination purposes or may be used for circuit protection purposes or may be used for both purposes. When used for both purposes, illumination from the chip 13 indicates that an overload condition has occurred.

More specifically, if the device 12 is to be used for both circuit protection purposes, a protective element 23 is bonded to the lead 21 and to an additional lead 26 so that the element 23 is electrically in parallel with the chip 13 and wire 19. Typically, the protective element 23 is a fusible wire but it may be a portion of the lead frame 17 (FIGS. 2 and 3) that is integral with the leads 21 and 26. The element 23 is designated to have a predetermined current-carrying capacity so that it will protect an external circuit (not shown) from loads exceeding that capacity.

On the other hand, if the device 12 is to be used only for illumination purposes, the protective element 23 is omitted. Or if the device 12 is to be used only for circuit protection purposes the chip is eliminated.

Although none is shown in the embodiment of FIG. 1, if desired a voltage-dropping resistor or a current-limiting diode may be serially coupled to the chip 13. By properly selecting such a resistor or diode, the chip 13 may be operated over a wide range of different voltages. (See the aforementioned U.S. Pat. No. 4,054,814.)

The device 12 also includes a transparent, insulating, unitary base 28, which is elongated for convenient handling. The base 28 is formed about and between the leads 16, 21 and 26 to encapsulate the chip 13 and the wire 19. Also, the protective element 23, if one is used in the device 12, is encapsulated.

Similarly, the lead 21 is integral with another contact, designated generally 38, which has a bridging portion 40 and lateral portions 42 extending beyond the base 28. The lateral portions 42 are wrapped around the base 28 to substantially conform to the configuration of such base 28.

The lateral portions 35 and 42 of the contacts 31 and 38 may fixed to the base 28 by any conventional expedient, such as an adhesive. These portions 35 and 42 are configured so that the ends of the base 28 are free of such portions 35 and 42 so as to permit light to pass out of such ends from the diode chip 13.

The contacts 31 and 38 are relatively large in comparison with the leads 16, 21 and 26. Hence, the contacts 31 and 38 have an adequate current-carrying capability for not only the chip 13, which requires a relatively small amount of current, but also for the protective element 23 which uses relatively larger amounts of current to open it.

Upon the insertion of the device 12 between a pair of conductive terminal brackets 45 and 47 (FIG. 11) of a board 48, the device 12 is coupled to an external circuit (not shown) by a pair of leads 51. Assuming the device 12 includes the chip 13 and protective element 23 and is to be used for both illumination and circuit protection purposes, if an overload condition occurs in this circuit, the protective element 23 melts, vaporizes or is otherwise destroyed. This opens the circuit and impresses the voltage of a source (not shown) of the circuit upon the chip 13 of the device 12.

As a result, the chip 13 is energized and therefore produces illumination and a visual display of the occurrence of the overload condition. Since the base 28 is transparent and its ends are free of contacts 31 and 38, the light resulting from the energization of the chip 13 passes not only laterally out of the base 28, but also axially out of its ends. Hence, the light is visible upon viewing the device 12 not only laterally but also axially. In axially viewing the device 12, the light is especially visible if the viewing is done at the end of the device 12 where the chip 13 is located.

If the device 12 includes the protective element 23 and is to be used for illumination and circuit protection purposes, such device 12 may be inserted lengthwise into a socket of a mounting block, such as that shown in the aforementioned U.S. Pat. No. 4,025,888, and thereby provide a visual indication of whether such element 23 has been subjected to an overload condition. Since the chip 13 and protective element 23 are enclosed within the same base 28 and are arranged to be viewed from their ends, the number of sockets and the size of the mounting block may be reduced.

Method of Making the Display and Circuit Protective Device

As is common in the semiconductor industry, a plurality of the devices 12 are made at the same time by batch processing. To this end the lead frame, designated generally 17 and shown in FIG. 2, is used. The lead frame 17 has a plurality of repetitive parts, each group of which is used in fabricating one device 12. For convenience, only one complete set of such parts is shown in FIGS. 2-10.

The lead frame 17 (FIG. 2) includes a pair of elongated parallel lead portions 53 and 54. The lead frame 17 also includes a pair of parallel support strips 57 and 58, which may be perforated for ease of handling. The strips 57 and 58 are integral with the lead portions 53 and 54. The support strips 57 and 58 will ultimately form the contacts 31 and 38 (FIG. 1) for the completed device 12.

The lead frame 17 also includes a support bar 61 located between each group of lead portions 53 and 54. The bar 61 joins, and is integral with, the strips 57 and 58. The bar 61 holds together the lead frame 17 and its parts during the various assembling stages required to make the device 12 of FIG. 1.

The lead frame 17 is stamped from an electrically conductive sheet, typically a copper, nickel and tin alloy. Usually it has various plated layers such as nickel, silver and gold with any of such layers being the outermost. The frame 17 is substantially planar in configuration and is pliable enough to be rolled up lengthwise about approximately a three inch radius without damaging it. The lead frame 21 may be made of a relatively soft material to aid in forming the lateral portions 42 about the base 28.

In fabricating the device 12 of FIG. 1, the lead frame 17 of FIG. 2 is subjected to a cutting operation which severs the lead portions 53 and 54 to form leads 16, 21 and 26 shown in FIG. 3.

One terminal of the light-emitting diode chip 13 (FIG. 3), typically formed from an appropriately doped semiconductor wafer, is bonded to the lead 16 as shown in FIG. 3. Preferably, the bonding is accomplished with a conductive epoxy. The area of the lead 16 where the chip 13 is bonded may be appropriately coated with a reflective material.

While only one chip 13 is shown in FIG. 3, it is to be understood that a plurality of such chips 13 may be bonded to one or several portions of the lead 16.

The wire 19, which is advantageously formed of gold, is bonded to the other terminal of the chip 13 and to the lead 21. A thin transparent, compliant insulating coating (not shown), of a material such as silicon rubber or an epoxy may be applied to the chip 13 after the wire 48 is bonded to it. Such coating protects this assembly from a later applied plastic encapsulant.

Next, if the device 12 of FIG. 1 is to be used for illumination and circuit protection purposes, the protective element 23 is appropriately bonded to the leads 21 and 26. Advantageously, a conductive epoxy may be used for such bonding.

Figure 4:
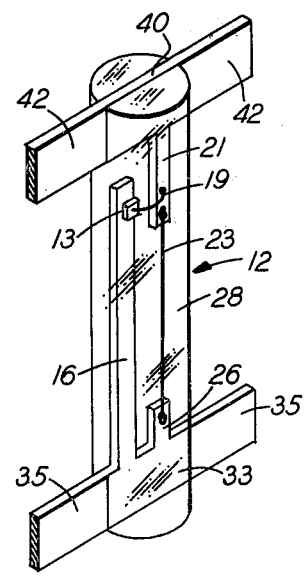
FIG. 4 is a perspective view of the assembly of FIG. 3 after the lead drame has been severed to form lateral portions that extend beyond the base, and illustrates still another stage in making the device of FIG. 1.

Then, the base 28 is formed about the assembly of parts that includes leads 16, 21, and 26, chip 13, wire 19 and protective element 23 as well as bridging portions 33 and 40 of the support strips 57 and 58, as shown in FIG. 3. In forming the base 28, lateral portions 35 and 42 are left extending beyond the base, as shown in FIGS. 3 and 4.

To form the base 28, various insulating materials may be used. For example, a material such as a thermoplastic or a thermosetting plastic may be used in a plastic encapsulation operation. And these materials may include epoxy or acrylic plastics.

Also, a foaming material may be added to the plastic. Or a core of foamed material may be formed around the protective element 23 before the base 28 is formed. Upon being heated in the plastic encapsulation operation, the foamed material around the element 23 contracts, leaving a cavity around the element 23. Depending on the foamed material, such contracting may occur by heating produced by current passing through the element 23. As a result of the contracting of the foamed material, for all practical purposes, the element 23 is in an atmosphere of air.

Also, the protective element 23 may be coated with an oxidizing agent to aid in its destruction upon the occurrence of an overload condition. Alternately, the agent may be such that it acquires an oxidizing ability upon being heated. Preferably, a fire retardant is added to the material of the base 28 if such coating is used.

Moreover, the material of the base 28 may be appropriately adjusted so as to control the rate at which the protective element 23 opens upon the occurrence of an overload condition. In other words, the device 12 may be made into a delay or "slow-blow" fuse by appropriately adjusting the material of the base 28.

After the base 28 is formed the support strips 57 and 58 of the lead frame 17 are severed. This separates a plurality of the devices 12 with laterally extending portions 35 and 42, only one such device 12 being shown in FIG. 4. The lateral portions 35 and 42 are formed about or wrapped around, the base 28 of the device 12 such that they substantially conform with the configuration of the base 28.

Alternate Embodiments

FIGS. 5-17 show various manufacturing stages of alternate embodiments of the present invention.

Figure 5:
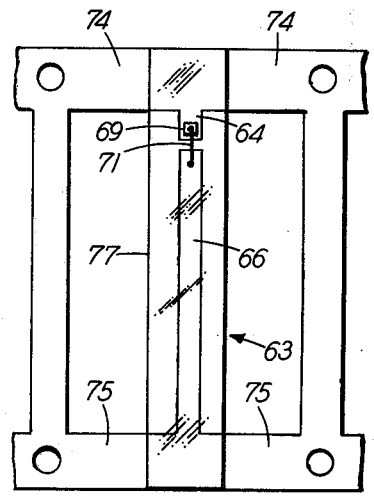
FIG. 5 is a front elevational view of an assembly of a device of another embodiment of the invention, and illustrates a stage in the process of making the device.

More specifically, FIG. 5 illustrates a stage in the process of making a simplified version of the electroluminescent device 12 of FIG. 1. This simplified version, which does not include a protective element, is designated generally by 63. The device 63 includes a pair of axially aligned and spaced leads 64 and 66.

In this version, one terminal of a chip 69 is bonded to the lead 64, while a wire 71 is bonded to the other terminal of the chip 69 and to the other lead 66. As in the device 12 of FIG. 1, the device 63 of FIG. 5 includes a pair of lateral portions 74 and 75. In the completed device 63, these portions 74 and 75 are wrapped around and fixed to a plastic encapsulated base 77.

Figure 6:
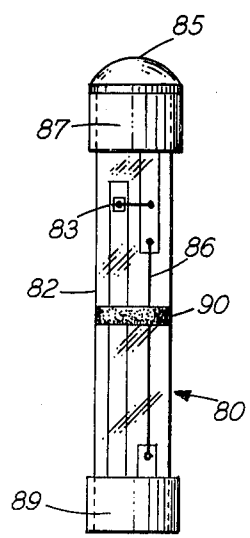
FIG. 6 is a front elevational view of a device of still another embodiment of the invention, showing a lens cap.

With respect to FIG. 6, it shows an electroluminescent display device, designated generally 80, of another embodiment of the invention. The device 80 is similar to the device 12 of FIG. 1, except that the end of a base 82 where a chip 83 is located has a portion of the base 82 formed into a lens cap 85. The lens cap 85 is preferably but not necessarily integral with the base 82. Such lens cap 85 better focuses the light from the chip 83 when it is energized.

The device 80 of FIG. 6 also includes a protective element 86 and lateral portions 87 and 89. These portions 87 and 89 are wrapped around and fixed to the base 82. These portions 87 and 89 comprise contacts for the device 80 and are similar to the portions 35 and 42 of the device 12 of FIG. 1.

An additional feature of the device 80 of FIG. 6 is a color-code band 90 formed on the base 82. In addition to, or in the alternative, the transparent base 82 and lens cap 85 may be tinted with the same color as that of the band 90. Such colors are associated with and aid in identifying the current carrying capacity of the protective element 86. With the base 82 and lens cap 85 so tinted, when the chip 83 is energized the same color light, only much brighter, is emitted from the lens cap 85. This aids in readily determining which, of many, such devices 80 may have been subjected to an overload condition and had their protective elements 86 opened by such an overload condition.

A particular color code scheme that might be used is as follows:

| Current Rating of Device 80 | Color of Band 90, Base 82, and Cap 85 |
| --- | --- |
| One Ampere | Red |
| Three Amperes | Green |
| Five Amperes | Yellow |

Figure 7:
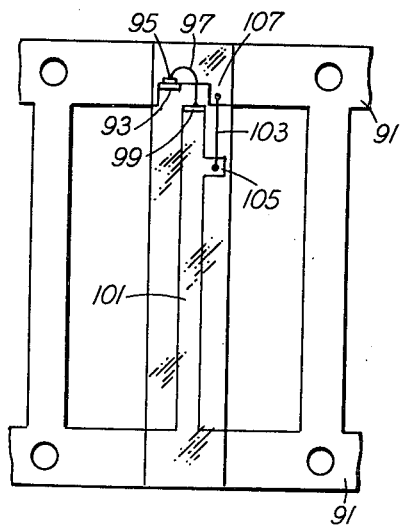
FIG. 7 is a front elevational view of an assembly of a device of still a further embodiment of the invention, illustrating a stage in the process of making the device and showing bent tabs for light-emitting and protective elements.

Referring now to FIG. 7, a stage in the process of making still another embodiment of the invention is illustrated. In this embodiment a portion of a support strip 91 is bent at a substantially 90° angle to form a tab portion 93. One terminal of a light-emitting diode chip 95 is bonded to this tab portion 93, as shown in FIG. 7.

A wire 97 is bonded to the other terminal of the chip 95 and to another tab portion 99 of a lead 101. A protective element 103 may be bonded between a planar tab portion 105 and a bridging portion 107 of the support strip 91.

The tab portions 93, 99 and 105 are preferably formed at the same time that the lead 101 is formed. The remaining fabricating steps are similar to those used in making the device 12 of FIG. 1.

Figure 8:
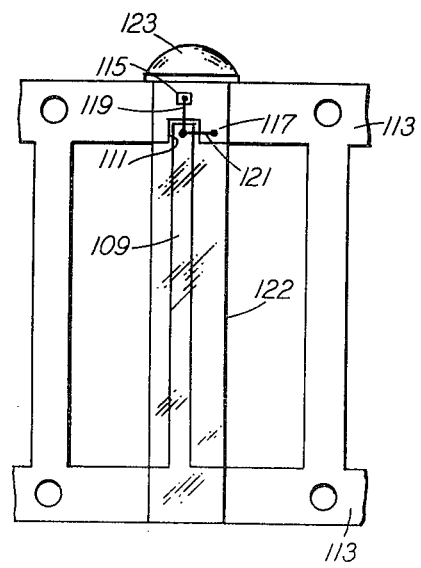
FIG. 8 is a front elevational view of an assembly of a device of another embodiment of the invention, illustrating a stage in the process of making the device and showing a cut-out segment into which a lead extends for bonding a protective and a conductive element.

Referring to FIG. 8, a still further embodiment of the invention is shown. In forming a lead 109 by a stamping cutting or similar operations, a cutout segment 111 is formed, preferably at the same time that the lead 109 is formed, in a support strip 113. The lead 109 is formed so that an end potion of it extends into the cutout segment 111. A light-emitting diode chip 115 is then directly bonded to a bridging portion 117 of the support strip 113.

Next, a wire 119 is bonded to one terminal of the chip 115 and to the lead 109. Also a protective element 121, if one is desired, may be bonded to the lead 109 and the bridging portion 117.

Finally, a base 122 is formed about the assembly of the lead 109, the chip 111, the wire 119 and the protective element 121. A lens cap 123 may also be formed over the chip 115 at the same time that the base 122 is formed. The remaining steps are similar to those used in making the device 12 of FIG. 1.

Figure 9:
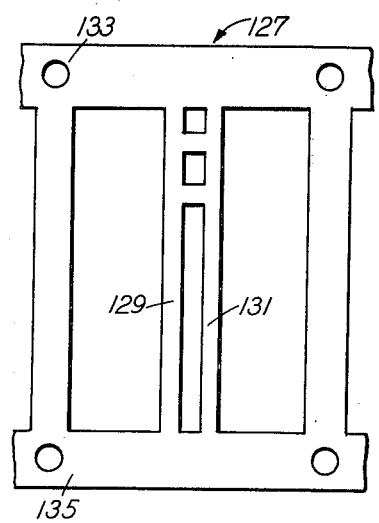
FIG. 9 is a front elevational view of an assembly of a device of still another embodiment of the invention, illustrating a stage in the process of making the device.
Figure 10:
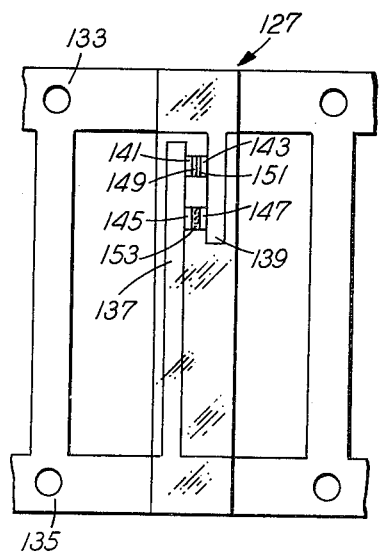
FIG. 10 is a front elevational view of the assembly of FIG. 9, illustrating another stage in the process of making the device and showing a protective element and a stack bonded light-emitting and a current-limiting element.

Referring to FIGS. 9 and 10, a stage in the process of making still another embodiment of the invention is shown. In this embodiment a lead frame 127 is formed with the configuration shown in FIG. 9 such that the lead frame 127 includes lead portions 129 and 131 joined to support strips 133 and 135.

From the lead portions 129 and 131, leads 137 and 139 are formed, as shown in FIG. 10, by conventional prior art techniques, such as stamping and cutting. In forming the leads 137 and 139, tab portions 141, 143, 145 and 147 are formed at substantially 90° to the leads 137 and 139.

Next, a light-emitting diode chip 149 that has been stack bonded to a current-limiting element, such as a diode or resistor chip 151, is bonded between the tab portions 141 and 147. The stack bonding is advantageously accomplished using a conductive epoxy although other materials may be used such as solder.

Also, a protective element 153 may be bonded between the tabs 145 and 147, as shown in FIG. 10. The remaining fabricating steps are similar to those used in making the device 12 of FIG. 1.

Figure 11:
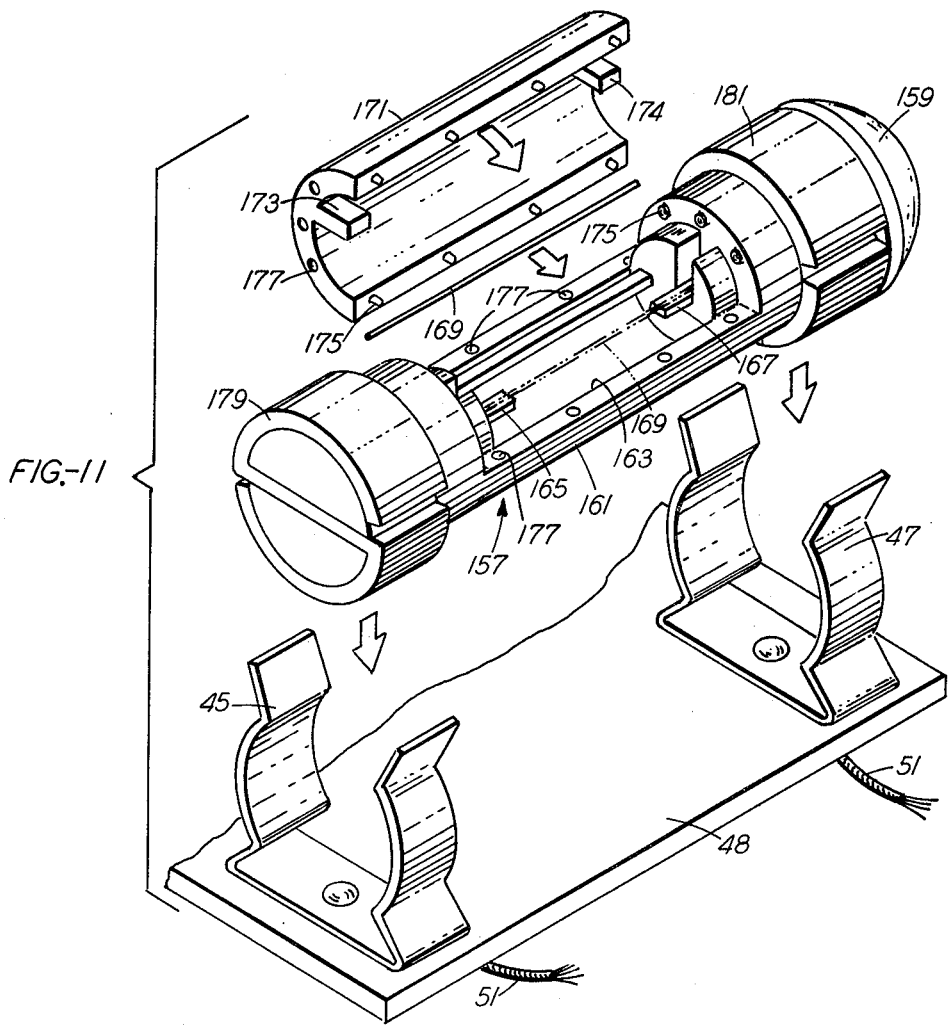
FIG. 11 is an exploded view of a completed device of another embodiment of the invention, showing a light-emitting element and a replaceable protective element, and the manner in which the device may be coupled to an external circuit.

FIG. 11 shows an exploded view of still another embodiment of the invention. More specifically, FIG. 11 shows an electroluminescent display and circuit protective device, designated generally by 157, having a lens cap 159, similar to that of the device 80 of FIG. 6, for a light-emitting diode chip (not shown) similar to those of FIGS. 1-10.

The device 157 includes an insulating base 161 that has a cavity 163 into which a pair of spaced and aligned leads 165 and 167 extend. The leads 165 and 167 are similar to leads 21 and 26 of the device 12 of FIG. 1.

The device 157 includes a replaceable protective element 169, which may be a fuse, removably mounted to the leads 165 and 167 as shown in FIG. 11.

A removable, resilient insulating cap 171 for the cavity 163 includes unitary internal pillars 173 and 174. These pillars 173 and 174 depend from the internal surface of the cap 171 and hold the replaceable protective element 169 in pressure engagement with the leads 165 and 167 when the cap 171 is mounted to the base 161 and over the cavity 163. Such pressure engagement assures good electrical contact between the protective element 169 and the leads 165 and 167.

A plurality of projections 175 in the cap 171 and the base 161 cooperate with a plurality of indentations 177 in the base 161 so that when the cap 171 is forced over the cavity 163, the cap 171 deflects and the projections 175 engage the indentations 177. This maintains the cap 171 firmly in place over the cavity 163.

Further, the device 157 includes lateral portions 179 and 181 wrapped around and fixed to the base 161 to form contacts for the device 157. These portions 179 and 181 engage the resilient conductive brackets 45 and 47, as shown in FIG. 11, when the device 157 is coupled to the external circuit (not shown) connected to the leads 51. The portions 179 and 181, because of their size and that of the brackets 45 and 47, offer good current carrying capacity. This capacity is enhanced by the pressure exerted by the resilient brackets 45 and 47 against the portions 179 and 181.

Upon the occurrence of an overload condition in the external circuit and the destruction of the protective element 169, the light-emitting diode chip (not shown in FIG. 12) is energized. Whereupon, light from the lens cap 159 indicates such overload condition and destruction of the element 169. Then, the cap 171 may be removed from the base 161 and the element 169 may be easily replaced. Thus, the device 157 of FIG. 12 is reusable.

Figure 12:
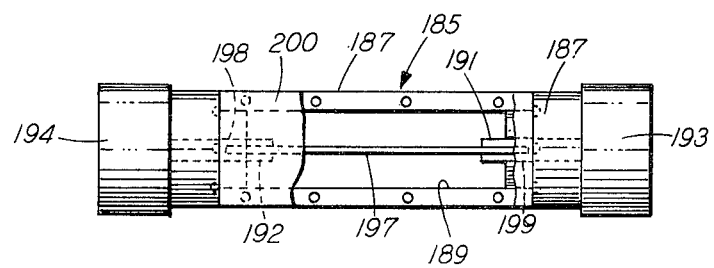
FIG. 12 is a front elevational view of a completed device of another embodiment of the invention similar to that of FIG. 11 except that the device of this FIG. 12 does not include a light-emitting element.

Referring to FIG. 12, an additional embodiment of the invention is shown. In particular, FIG. 12 shows a protective device, designated generally 185, which is similar to the device 157 of FIG. 11 except that the device 185 does not include any light-emitting element.

The device 185 includes an insulating base 187, which may be either transparent or opaque, having a cavity 189 and a pair of leads 191 and 192 extending into the cavity 189. The leads 191 and 192 are integral with lateral portions 193 and 194 which are wrapped around and fixed to the base 187. These portions 193 and 194 comprise contacts for the device 185.

A replaceable protective element 197 is removably mounted on the leads 191 and 192 and held in place by a pair of pillars 198 and 199 of a resilient insulating cap 200. Similar to the cap 171 of the device 157 of FIG. 11, the cap 200 is removably mounted to the base 187 and over the cavity 189 of the device 157. When the protective element 197 is destroyed by a circuit overload condition, the cap 200 may be removed and the element 197 may be replaced with a new one.

Figure 13:
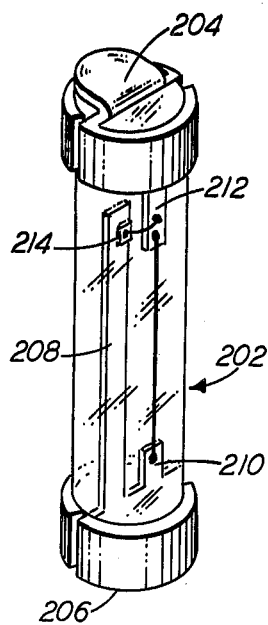
FIG. 13 is a perspective view of an electroluminescent display and circuit protective device of another embodiment of the present invention, showing contacts and end tab portions that have been conformily shaped about opposite ends of the base of the device.

Referring to FIG. 13 there is shown an electroluminescent display and circuit protective device, designated generally 202, of another embodiment of the invention. The device 202 is similar to the device 12 of FIG. 1 except that it includes end tab portions 204 and 206 extending axially from a first group of conductive leads 208 and 210 and from another conductive lead 212. The end tab portions 204 and 206 provide endwise contacts for the device 202, and at the same time permit light from a light-emitting diode chip 214 to pass axially out of the device 202. The light also passes radially out of the device 202.

Figure 15:
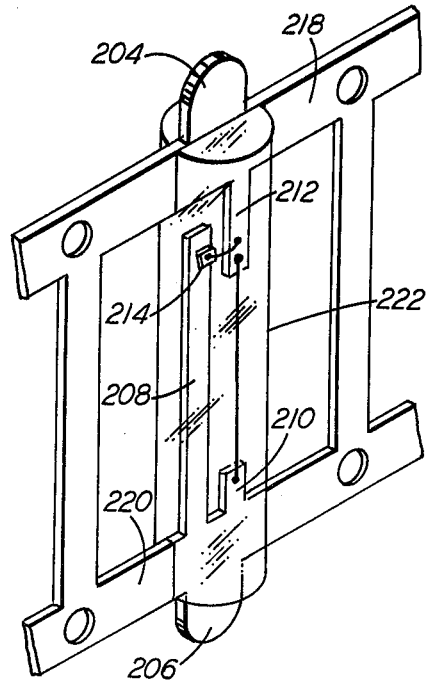
FIG. 15 is a perspective view of an assembly including the lead frame of FIG. 14 and a light-emitting and protective element bonded thereto, showing a base for the device of FIG. 13 encapsulated about such assembly and illustrating another stage in making such device.
Figure 14:
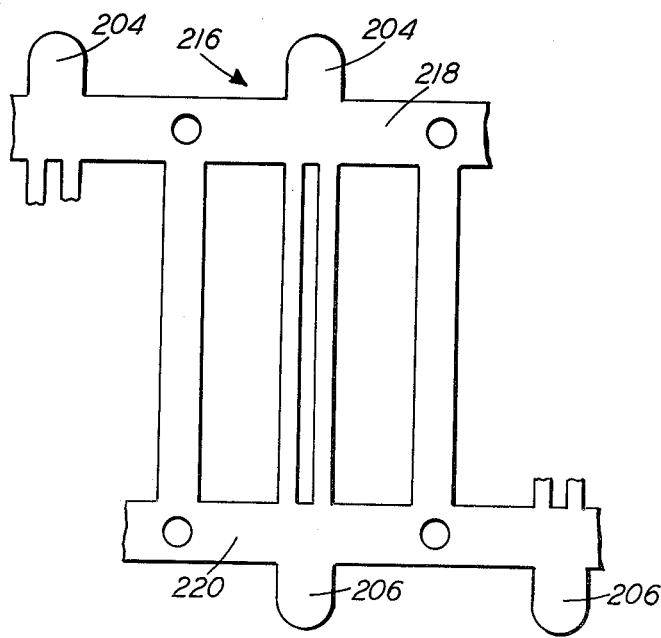
FIG. 14 is a front elevational view of a lead frame, illustrating a stage in the process of making the device of FIG. 13.
Figure 16:
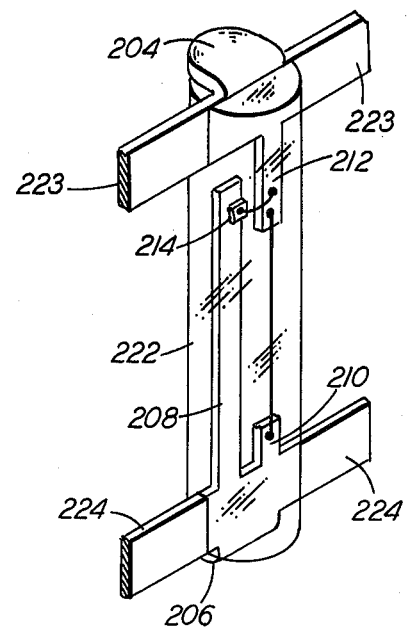
FIG. 16 is a perspective view of the assembly of FIG. 15 after the lead frame has been severed to form laterally portions that extend beyond the base and illustrate still another stage in making the device of FIG. 13.

FIGS. 14–16 illustrate various steps in the manufacture of the device 202 and are similar to FIGS. 2–4 except that lead frame 216 includes the end tab portions 204 and 206 extending beyond a pair of support strips 218 and 220. After a base 222, FIG. 15, has been formed the end tab portions 204 and 206 are bent to substantially conform to the configuration of the ends of the base 222. Preferably, these tab portions 204 and 206 are fixed to the ends of the base 222, as shown in FIG. 16. In the final manufacturing step, lateral portions 223 and 224 are formed about and fixed to the base 222.

Figure 17:
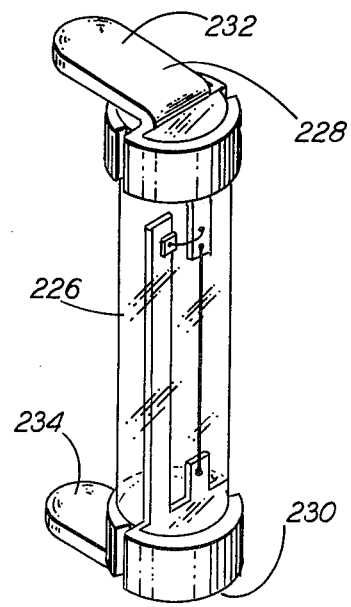
FIG. 17 is a perspective view of an electroluminescent display and circuit protective device of the present invention, showing contacts and end tab portions that have been conformally shaped about the opposite ends of the base and also showing cantilever portions further extending from the end tab portions laterally beyond the end of the base.

FIG. 17 shows an electroluminescent display and circuit protective device, designated generally 226, of another embodiment of the invention. The device 226 is similar to the device 202 of FIG. 13 except that in addition to including end tab portions 228 and 230, it includes cantilever portions 232 and 234 extending from the end tab portions 228 and 230 laterally beyond the ends of a base 236 of the device 226. These cantilever portions 232 and 234 enable the device 226 to be inserted into slots (not shown) configured to receive such cantilever portions 232 and 234, and in this way make a good electrical contact for the device 206.

It is to be understood that the above-described arrangements are simply illustrative of the application of the principles of the invention. Numerous other arrangements may readily be devised by those skilled in the art which embody the principles of the invention and fall within its spirit and scope.

What is claimed is:

1. An electroluminescent display device, comprising:
   at least two conductive leads spaced from each other with a light-emitting element electrically coupled between such leads;
   a transparent, insulating base formed about and between the leads and encapsulating the leads and the light-emitting element; and
   at least one lateral portion of each lead extending beyond the base and substantially conforming to the configuration of the base.

2. The device of claim 1, wherein each lateral portion is wrapped around and fixed to the base, and the base is a lens for the light-emitting element and permits light from such element to pass therethrough.

3. The device of claim 2, wherein:
   light from the light-emitting element is permitted to pass laterally out of the base; and
   at least one end of the base is free of the lateral portion to permit light from the light-emitting element to pass axially along the base and out of such end.

4. The device of claim 1, wherein:
   the base is circular in cross section, elongated and has opposed end portions;
   one lead extends to each end of the base; and
   each lead includes two lateral portions that extend beyond opposite sides of the base and that are formed about the base so that each end of the base has a substantially ring-type contact.

5. The device of claim 1, wherein a protective element is electrically coupled between the leads in parallel with the light-emitting element so that upon the occurrence of an overload condition in a circuit coupled to the lateral portions, the protective element is decoupled resulting in the energization of the light-emitting element.

6. The device of claim 5, wherein the protective element is a replaceable fuse.

7. The device of claim 5, wherein the base has a color formed on it which is associated with the current-carrying capacity of the protective element, and the same color is emitted by the energization of the light-emitting element.

8. The device of claim 6, further comprising:
   a cavity in the base exposing the leads and the replaceable fuse; and a removable, resilient cap for the cavity to permit access to the fuse to enable its replacement, the cap having a curvilinear cross section and a unitary internal portion for holding the replaceable fuse in engagement with the leads.

9. The device of claim 1, wherein:
the light-emitting element is a light-emitting diode chip; and
a current-limiting chip is bonded between the diode chip and one of the leads.

10. The device of claim 1, wherein:
each lead has a tab portion bent at a substantially 90°-angle to it; and
the light-emitting element is bonded to one of the tab portions and a conductor is bonded between such element and the other tab portions.

11. The device of claim 10, wherein a protective element is coupled to the leads so that upon the occurrence of an overload condition in a circuit coupled to the leads, the protective element is decoupled, resulting in the energization of the light-emitting element.

12. The device of claim 1, wherein:
an end portion of one lead is located within, and spaced from, a cut-out segment of the other lead; and
a protective element is bonded to each lead.

13. The device of claim 1, wherein:
each lead has two tab portions bent at substantially 90° angles to such lead, and the tab portions of each lead are opposed to and aligned with the tab portions of the other lead;
the light-emitting element is bonded between one set of aligned tab portions; and
a protective element is bonded between the other set of tab portions.

14. The device of claim 10, wherein a voltage dropping resistor chip is bonded between the light-emitting element and the tab portion of one of the leads.

15. The device of claim 1, wherein the leads are axially aligned and spaced from each other.

16. The device of claim 1, wherein:
the light-emitting element is located adjacent one end of the base; and
the base at such end is formed into a lens cap.

17. A protective device, comprising:
at least two conductive leads spaced from each other with a protective element electrically coupled between such leads;
an insulating base formed about and between the leads and encapsulating the leads; and
at least one lateral portion of each lead extending beyond the base and substantially conforming to the configuration of the base, whereby upon the occurrence of an overload condition in a circuit coupled to such lateral portions, the protective element is decoupled.

18. The device of claim 17, wherein a cavity surrounds the protective element.

19. The device of claim 17, wherein the base is a foam plastic so that upon the occurrence of an overload condition the protective element partially melts the foam plastic to produce a cavity in the vicinity of the protective element.

20. The device of claim 17, wherein the protective element is coated with an oxidizing agent.

21. The device of claim 17, wherein the protective element is a replaceable fuse.

22. The device of claim 21, further comprising:

a cavity in the base exposing the leads and the replaceable fuse; and
a removable, resilient cap for the cavity to permit access to the fuse to enable its replacement, the cap having a curvilinear cross section and a unitary internal portion for holding the replaceable fuse in engagement with the leads.

23. A method of making an electroluminescent display device, comprising:
forming from a sheet of conductive material at least two leads spaced from each other;
electrically coupling a light-emitting element between such leads;
forming at least one lateral portion from the sheet of conductive material for each lead integral with such lead;
forming a transparent, insulating base about and between the leads and encapsulating the leads and the light-emitting element, the lateral portions extending beyond the sides of the base; and
substantially conforming such lateral portions to the configuration of the base.

24. The method of claim 23, wherein the lateral portions are conformed to the configuration of the base by wrapping them around the base such that at least one end of the base is free of the lateral portion to permit light from the light-emitting element to pass out of such end, and further comprising fixing such lateral portions to the base.

25. The method of claim 23 further comprising coupling a protective element between the leads so that upon the occurrence of an overload condition in a circuit coupled to the lateral portions, the protective element is decoupled, resulting in the energization of the light-emitting element.

26. The method of claim 25, wherein the protective element is a replaceable fuse and the method further comprises forming a cavity in the base to expose the leads and the replaceable fuse and forming a removable, resilient cap for permitting access to the fuse to enable its replacement.

27. The method of claim 23, wherein the light-emitting element is a light-emitting diode chip, the method further comprising bonding a voltage-dropping resistor chip between the diode chip and one of the leads.

28. A method of making a protective device, comprising:
forming from a sheet of conductive material two leads spaced from each other;
coupling a protective element between the two leads;
forming at least one lateral portion from the sheet of conductive material for each lead integral with such lead;
forming an insulating base about and between the leads and encapsulating the leads, the lateral portions extending beyond the sides of the base; and
substantially forming the lateral portions to the configuration of the base.

29. The method of claim 28, wherein the lateral portions are conformed to the configuration of the base by wrapping them around the base such that at least one end of the base is free of the lateral portion, and further comprising fixing such lateral portions to the base.

30. The device of claim 1 or claim 17, further comprising:
at least one end tab portion of at least one of the conductive leads extending axially beyond the end of the base and substantially conforming to the configuration of the end of the base.

31. The device of claim 1 or claim 17, further comprising:
at least one end tab portion of at least one of the conductive leads extending axially beyond and fixed to the end of the base and substantially conforming to the configuration of the end of the base, and having a cantilever portion further extending from the end tab portion laterally beyond the end of the base.

* * * * *